United States Patent
Walker et al.

(10) Patent No.: US 10,318,465 B2
(45) Date of Patent: Jun. 11, 2019

(54) USER STATION FOR A BUS SYSTEM AND METHOD FOR INCREASING INTERFERENCE IMMUNITY IN THE AREA OF ELECTROMAGNETIC COMPATIBILITY FOR A USER STATION

(71) Applicant: Robert Bosch GmbH, Stuttgart (DE)

(72) Inventors: Steffen Walker, Reutlingen (DE); Axel Pannwitz, Radebeul (DE)

(73) Assignee: ROBERT BOSCH GMBH, Stuttgart (DE)

( * ) Notice: Subject to any disclaimer, the term of this patent is extended or adjusted under 35 U.S.C. 154(b) by 125 days.

(21) Appl. No.: 15/312,918

(22) PCT Filed: May 4, 2015

(86) PCT No.: PCT/EP2015/059651
§ 371 (c)(1),
(2) Date: Nov. 21, 2016

(87) PCT Pub. No.: WO2015/176942
PCT Pub. Date: Nov. 26, 2015

(65) Prior Publication Data
US 2017/0199837 A1    Jul. 13, 2017

(30) Foreign Application Priority Data
May 21, 2014   (DE) ......................... 10 2014 209 694

(51) Int. Cl.
*G06F 13/36*   (2006.01)
*G06F 13/40*   (2006.01)
(Continued)

(52) U.S. Cl.
CPC ......... *G06F 13/42* (2013.01); *G01R 31/2818* (2013.01); *G06F 13/36* (2013.01);
(Continued)

(58) Field of Classification Search
CPC ...... G06F 13/36; G06F 13/4022; G06F 13/42; G01R 31/2818; H04L 12/40084;
(Continued)

(56) References Cited

U.S. PATENT DOCUMENTS 5,587,678 A * 12/1996 Dijkmans ........ H03K 19/00361
326/26
6,092,138 A *  7/2000 Schutte ................... G06F 13/00
710/113
(Continued)

FOREIGN PATENT DOCUMENTS

| DE | 10 2011 007766 A1 | 10/2012 |
|----|-------------------|---------|
| EP | 0 858 195 A2      | 8/1998  |
| WO | 2006/133731 A1    | 12/2006 |

OTHER PUBLICATIONS

International Search Report for PCT/EP2015/059651, dated Aug. 26, 2015, 2 pages.

*Primary Examiner* — Eric T Oberly
(74) *Attorney, Agent, or Firm* — Norton Rose Fulbright US LLP; Gerard Messina

(57) ABSTRACT

A user station for a bus system and a method for reducing line-related emissions in a bus system as described. The user station includes a transmitter unit for sending a message to another user station of the bus system via the bus system, an exclusive, collision-free access of a user station to a bus of the bus system being at least temporarily provided, and a switching unit for switching off a current limiting function of the transmitter unit when an HF signal component on the message sent by the transmitter unit is detected and a method for measuring the interference immunity in the area of electromagnetic compatibility is carried out for the transmitter unit.

11 Claims, 3 Drawing Sheets

(51) Int. Cl.
*G06F 13/42* (2006.01)
*G01R 31/28* (2006.01)
*H04L 12/40* (2006.01)
*H04L 12/413* (2006.01)
*H04L 25/02* (2006.01)

(52) U.S. Cl.
CPC ...... *G06F 13/4022* (2013.01); *H04L 12/4013* (2013.01); *H04L 12/40084* (2013.01); *H04L 12/40169* (2013.01); *H04L 12/413* (2013.01); *H04L 12/4135* (2013.01); *H04L 25/0286* (2013.01); *H04L 2012/40215* (2013.01)

(58) Field of Classification Search
CPC ........... H04L 12/4013; H04L 12/40169; H04L 12/413; H04L 12/4135; H04L 25/0286; H04L 2012/40215
See application file for complete search history.

(56) References Cited

U.S. PATENT DOCUMENTS

| | | | | |
|---|---|---|---|---|
| 2002/0054647 | A1* | 5/2002 | Heuts | H04L 25/063 375/257 |
| 2008/0200128 | A1* | 8/2008 | Hemon | H04L 25/0274 455/66.1 |
| 2010/0033165 | A1* | 2/2010 | Rostamzadeh | G01R 31/001 324/127 |
| 2014/0365693 | A1* | 12/2014 | Monroe | G06F 13/385 710/105 |
| 2015/0244632 | A1* | 8/2015 | Katar | H04L 47/2433 370/230 |

* cited by examiner

USER STATION FOR A BUS SYSTEM AND METHOD FOR INCREASING INTERFERENCE IMMUNITY IN THE AREA OF ELECTROMAGNETIC COMPATIBILITY FOR A USER STATION

FIELD OF THE INVENTION

The present invention relates to a user station for a bus system and a method for increasing the interference immunity in the area of electromagnetic compatibility to meet the signal symmetrization demands of the bus system.

BACKGROUND INFORMATION

The CAN bus system is used for the networking of devices for communication, for example, in a vehicle and, because of its parallel topology, it is very well-suited for many other communication applications. The CAN bus system transmits messages using the CAN protocol as described in the CAN specification in ISO 11898.

At present, the use of CAN bus systems is increasingly required, in which a higher clock rate and, for this reason, a higher data transfer rate is possible than in CAN, for example, CAN-HS, CAN-FD, etc. In CAN-HS bus systems (HS=high-speed) a data transfer rate of up to 500 Kbit per second (500 Kbp/s) is possible. In a CAN-FD bus system, a data transfer rate of greater than 1 Mbit per second (1 Mbp/s), 2 Mbp/s, 4 Mbp/s and potentially greater is possible. In CAN-FD, messages are transmitted according to the specification "CAN with Flexible Data Rate, Specification Version 1.0" (source: http://www.semiconductors.bosch.de).

Even though the introduction of CAN-HS and CAN-FD enables the migration of existing control units and vehicle platforms to higher data rates, there is however a problem when a CAN transceiver is to carry out a conventional CAN-HS operation and also a CAN-FD operation.

At present, all parameters of a CAN transceiver are namely fixedly configured. A CAN transceiver is also called a CAN transmitter/receiver unit. The configuration or dimensioning of the CAN transceiver selected at that time has to comply with all specified demands. Apart from a compliance with the functional parameters, such demands are, for example, related to:
 emission;
 direct power injection (DPI) which is a method for the measurement of interference immunity in the area of electromagnetic compatibility (EMC); and
 electrostatic discharge (ESD).

In CAN bus systems, the signal on the bus includes two signals CAN_H and CAN_L, which are ideally in phase opposition, so that the electrical and magnetic fields of both signal lines cancel each other out. In a test, in which it is checked whether the demands related to direct power injection (DPI) are met, the so-called DPI test, a signal transmitted on the CAN bus may only be shifted by 200 ns.

SUMMARY

It is an object of the present invention to provide a user station for a bus system and a method which solve the aforementioned problems. In particular, a user station for a bus system and a method are to be provided in which a great interference immunity of the transmitted signals is present and in which, in particular, a maximum of only one signal shift of two bus signals in phase opposition occurs within the predefined limits of the DPI test.

The object is achieved by a user station for a bus system as recited in claim 1. The user station includes a transmitter unit for sending a message to another user station of the bus system via the bus system, an exclusive, collision-free access of a user station to a bus of the bus system being provided at least temporarily, and a switching unit for switching off a current limiting function of the transmitter unit when an HF signal component on the message sent by the transmitter unit is detected and a method for the measuring of interference immunity in the area of electromagnetic compatibility is carried out for the transmitter unit.

With the user station, a conventional CAN-HS operation and also a CAN-FD operation can be carried out, even if all parameters of a CAN transceiver of the user station are fixedly configured. It is prevented that a shifting of the mean values of the voltages on CAN_L and CAN_H and, for this reason, an interference of the communication occurs so that the demands, in particular, of the DPI test may be met for the user station.

Furthermore, the user station enables a very good control of the currents in CAN_H and CAN_L of the bus system, statically and during switching edges when switching from the dominant to the recessive state and vice versa.

Thus, the user station has a high immunity to injected interferences, which may be verified by a DPI test (DPI=direct power injection) or a BCI test (BCI=bulk current injection).

A further advantage of the user station is that an operation without common mode chokes is possible.

Advantageous further embodiments of the user station are indicated in the dependent patent claims.

For example, the switching unit may feature: a first transistor, which is connected in parallel to an output current mirror for a signal CAN_L of the bus system and which does not have a current limiting function, and a second transistor, which is connected in parallel to an output current mirror for a signal CAN_H of the bus system and which does not have a current limiting function.

The switching unit is potentially configured to switch on the first and second transistor at the end of a recessive to dominant switching edge of signals CAN_L, CAN_H and to switch the first and second transistor off before the onset of a dominant to recessive switching edge of signals CAN_L, CAN_H, or the switching unit is configured to switch on the first and the second transistor during a recessive to dominant switching edge of signals CAN_L, CAN_H and to switch off the first and second transistor during a dominant to recessive switching edge of signals CAN_L, CAN_H.

It is also possible that the switching unit for switching off the current limiting function of the transmitter unit is configured in such a way that the edge time of signals CAN_L, CAN_H does not change.

The transmitter unit may feature an edge controller for symmetrizing switching edges in the bus system, the edge controller including an element for generating the setpoint voltage characteristic on a bus of the bus system and a current mirror for transmitting the generated setpoint voltage characteristic to the bus, the element for generating the setpoint voltage characteristic including a Miller capacitor, which is connected to a PMOS transistor on one side and to a resistor on the other side, and/or the element for generating the setpoint voltage characteristic including two current sources, which are connected to a PMOS transistor.

It is possible that the edge controller includes two current sources, one Miller capacitor, one PMOS transistor and one resistor, and the two current sources and the Miller capacitor being connected to the gate of the PMOS transistor.

The current mirror may be connected to the bus via MOS high-voltage transistors.

Moreover, the transmitter unit may feature a reverse polarity protection diode for the protection of the circuit against a potential of the dominant level in the bus system and a reverse polarity protection diode for protection against the signal CAN_L.

The user station described previously may be part of a bus system which includes a bus and at least two user stations connected via the bus in such a manner that they are able to communicate with one another, and at least one of the at least two user stations being one of the user stations described previously.

Moreover, the object mentioned previously is achieved by a method for increasing the interference immunity in the area of electromagnetic compatibility for a user station as recited in claim 10. In this method, a transmitter unit sends a message to another user station of the bus system via the bus system, an exclusive, collision-free access of a user station to a bus of the bus system at least temporarily being provided, and a switching unit switching off a current limiting function of the transmitter unit when an HF signal component on the message sent by the transmitter unit is detected and a method for the measurement of interference immunity in the area of electromagnetic compatibility is carried out for the transmitter unit.

The method offers the same advantages as mentioned previously in reference to the user station.

Additional possible implementations of the present invention also include combinations not mentioned explicitly of features or specific embodiments described previously or hereinafter with respect to the exemplary embodiments. Those skilled in the art will also add individual aspects as improvements or additions to the respective basic form of the present invention.

DETAILED DESCRIPTION

Figure 1:
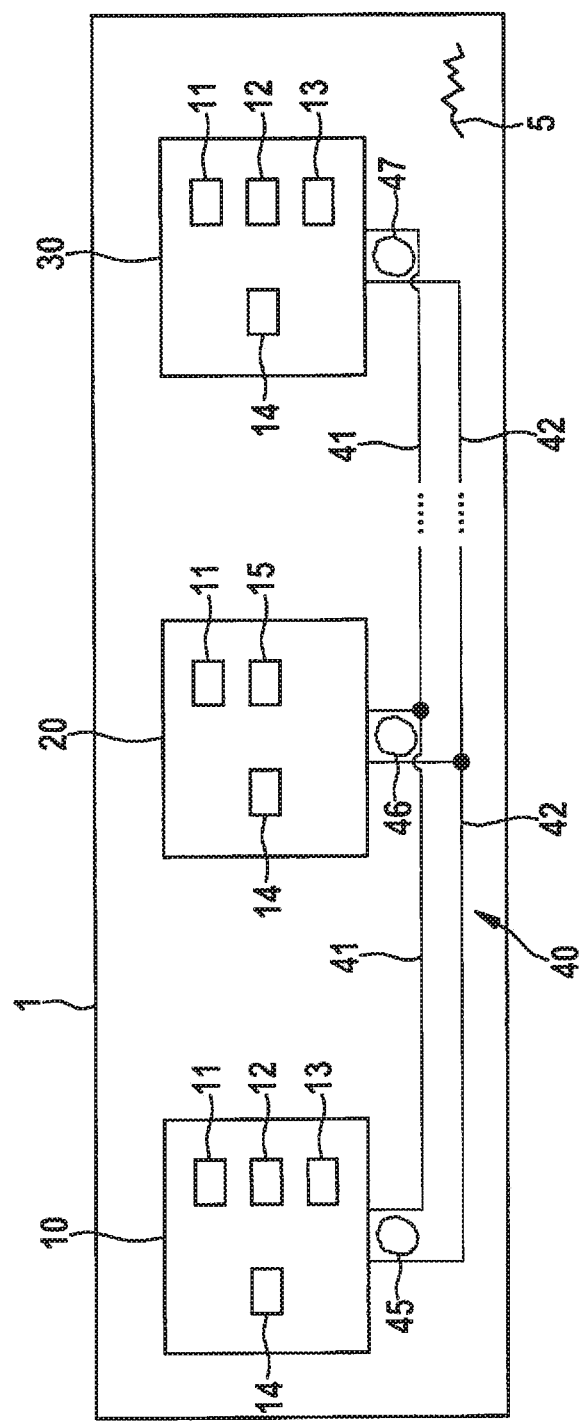
FIG. 1 shows a simplified block diagram of a bus system according to a first exemplary embodiment.

FIG. 1 shows a bus system 1, which may, for example, be a CAN bus system, a CAN-FD bus system, etc. Bus system 1 may be used in a vehicle, in particular a motor vehicle, an airplane, etc. or in a hospital, etc.

In FIG. 1, bus system 1 has a plurality of user stations 10, 20, 30, each being connected to a bus 40 including a first bus core 41 and a second bus core 42. Bus cores 41, 42 may also be referred to as CAN_H and CAN_L and are used for inputting the dominant levels in the transmission state. Messages 45, 46, 47 in the form of signals may be transmitted via bus 40 between the individual user stations 10, 20, 30. User stations 10, 20, 30 may, for example, be control units or display devices in a motor vehicle.

As shown in FIG. 1, user stations 10, 30 each have a communication control unit 11, a transmitter unit 12, a receiver unit 13 and a detection unit 14. In contrast, user station 20 has a communication control unit 11, a detection unit 14 and a transmitter/receiver unit 15. Transmitter units 12, receiver units 13 of user stations 10, 30 and transmitter/receiver unit 15 of user station 20 are each connected directly to bus 40, although this is not shown in FIG. 1.

Communication control unit 11 is used for controlling a communication of respective user station 10, 20, 30 via bus 40 with another user station of user stations 10, 20, 30 connected to bus 40. Transmitter unit 12 is used for sending messages 45, 47 in the form of signals, reducing line-related emissions in bus system 1 so that the signal symmetrization demands of bus system 1 are met, as later described in greater detail. Detection unit 14 is used to detect a very schematically described high frequency component or HF component 5 on the signals of messages 45, 46, 47, which are of low frequency. Communication control unit 11 may be designed as a conventional CAN controller. In relation to its reception functionality, receiver unit 13 may be designed as a conventional CAN transceiver. Transmitter/receiver unit 15 may be designed as a conventional CAN transceiver.

Figure 2:
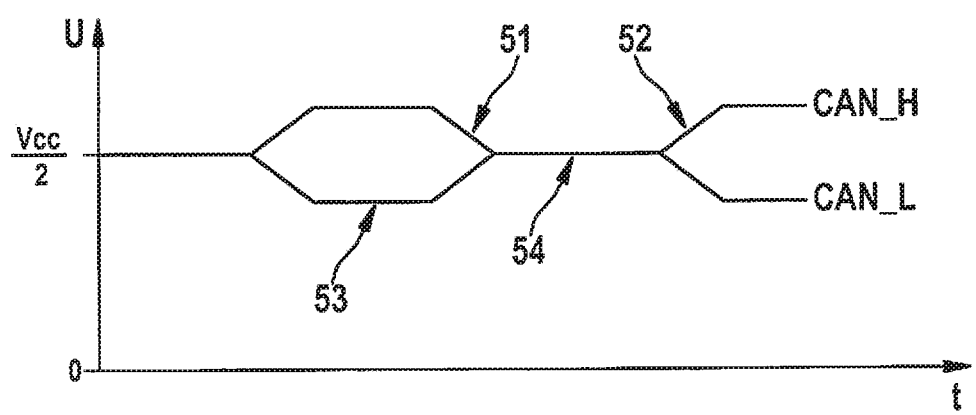
FIG. 2 shows a setpoint voltage characteristic of a bus signal over time in the bus system according to the first exemplary embodiment.
Figure 3:
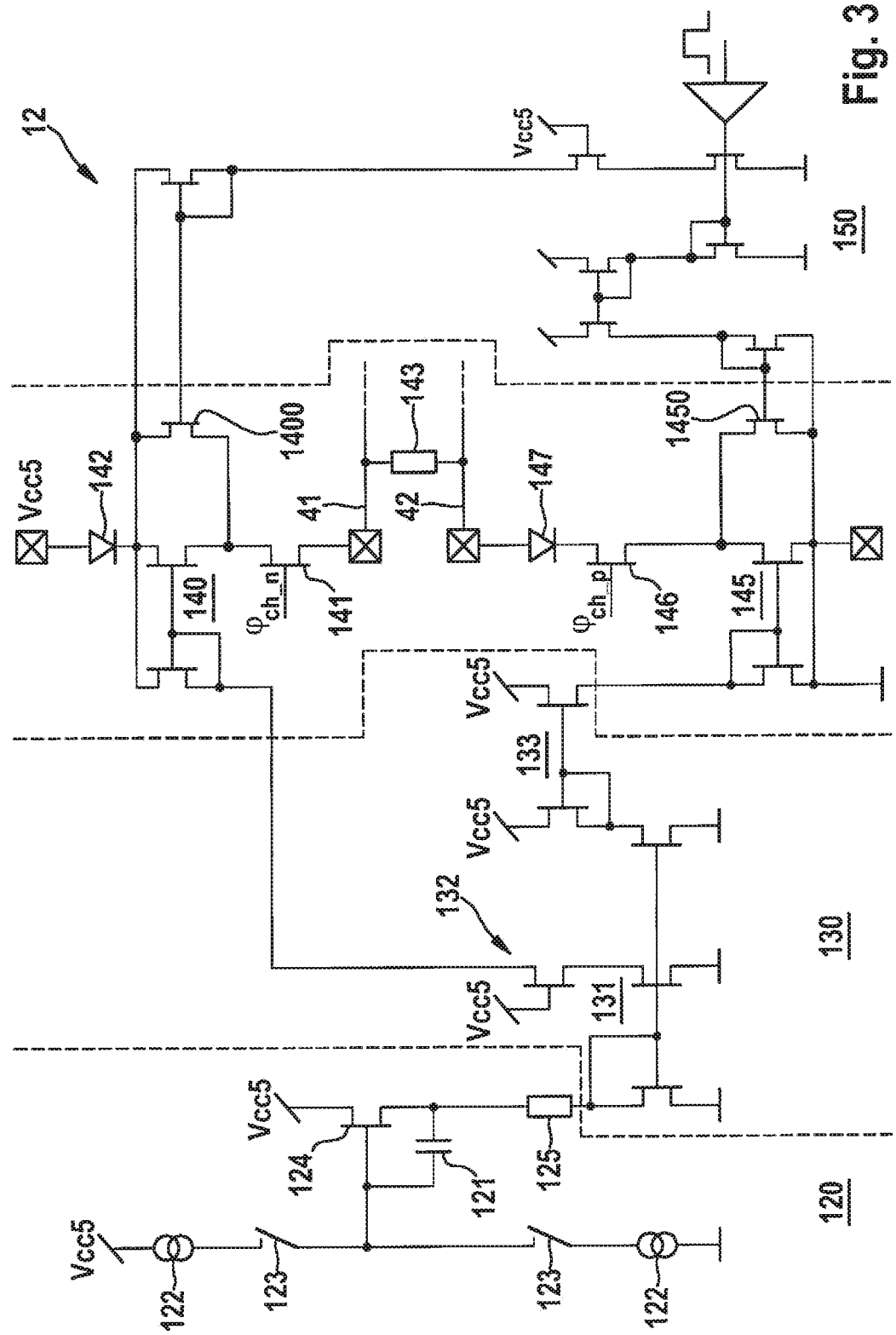
FIG. 3 shows an electrical circuit diagram of a signal symmetrization unit of a user station of the bus system according to the first exemplary embodiment.

FIG. 2 shows a voltage characteristic U over time t, having switching edges 51, 52, as it is generated by transmitter unit 12 described in greater detail in FIG. 3. Switching edge 51 corresponds to a transition of the signal from dominant state 53 to recessive state 54. Switching edge 52 corresponds to a transition of the signal from recessive state 54 to dominant state 53.

The shown voltage characteristic has switching edges 51, 52 such as a setpoint voltage characteristic to be generated by transmitter unit 12.

Thus, according to FIG. 2, when transmitting messages 45, 46, 47 (FIG. 1) in the form of signals to bus 40 (FIG. 1), it is, depending on the data to be transmitted, switched between a high and a low signal state or vice versa, the high signal state being also referred to as the dominant state and the low signal state also being referred to as the recessive state.

It is apparent from FIG. 2, the CAN bus is a differential bus system having two signals CAN_H and CAN_L in phase opposition, subjected to high demands with respect to signal symmetrization. In this context it applies that the better the signal symmetrization, the lower the interference emission and the interference at a user station, for example a car radio. Signals CAN_H and CAN_L, which are in phase opposition, are for this reason controlled in such a way that their mean value deviates preferably little from mean voltage VCC5/2=2.5V.

In the DPI test (DPI=Direct Power Injection), a method for the measuring of interference immunity in the area of the electromagnetic compatibility (EMC) is carried out. If signals CAN_L and CAN_H are shifted by more than 200 ns, the DPI test reveals that an error is present. A greater edge steepness of signals CAN_L and CAN_H or a faster switching edge from recessive to dominant or vice versa of signals CAN_L and CAN_H may not be able to correct the error. For this reason, in this exemplary embodiment, transmitter unit 12 is implemented, as shown in FIG. 3.

According to FIG. 3, transmitter unit 12 includes an edge controller 120 with the aid of a simulation of a Miller capacitor 121 and current sources 122, an almost instantaneous current mirror 130, an output current mirror CAN_H 140 and an output current mirror CAN_L 145.

In addition to Miller capacitor 121 and current sources 122, edge controller 120 also includes switching elements 123 and a PMOS transistor 124. Miller capacitor 121 is connected to the gate of PMOS transistor 124. Furthermore, current sources 122 are connected to the gate of PMOS transistor 124 via switching elements 123. Miller capacitor 121 is connected on its other side to the drain of PMOS transistor 124. A resistor 125 converts the voltage ramp generated at the drain of PMOS transistor 124 into a current signal for the input of a current mirror 131. In so doing, resistor 124 specifies the maximum short circuit current in bus core 41 (CAN_H) and bus core 42 (CAN_L).

In addition to NMOS current bank 131, current mirror 130 also includes an NMOS high-voltage cascode 132, hereinafter also referred to as an NMOS HV cascode 132, and a PMOS current mirror 133 for low voltage. NMOS HV cascode 132 is connected to output current mirror 140. PMOS current mirror 133 is connected to output current mirror 145. Output current mirror CAN_H 140 is a PMOS current mirror for low voltage for CAN_H output current generation. Output current mirror CAN_L 145 is an NMOS current mirror for low voltage for CAN_L output current generation.

A PMOS high-voltage cascode 141, hereinafter also referred to as PMOS HV cascode 141, is connected to output current mirror CAN_H 140. PMOS HV cascode 141 is needed for a case of error "short circuit of CAN_H to −27V." Moreover, a reverse polarity protection diode 142 is connected to output current mirror CAN_H 140 for protecting the circuit against positive overvoltage from CAN_H. A negative potential φch_n relative to the positive voltage supply downstream from reverse polarity protection diode 142 is applied to PMOS HV cascode 141.

An NMOS high-voltage cascode 146, hereinafter also referred to as NMOS HV cascode 146, is connected to output current mirror CAN_L 145. NMOS HV cascode 146 is needed for a case of error "short circuit of CAN_L to 40 V." Moreover, a reverse polarity protection diode 147 is connected to output current mirror CAN_L 145. Reverse polarity protection diode 147 is needed in the case of error "short circuit of CAN_L to −27 V." A positive potential φch_p relative to ground is applied to NMOS HV cascode 146.

Between PMOS HV cascode 141 and reverse polarity protection diode 147, bus 40 is connected to bus cores 41, 42, which are closed off by resistor 143. Thus, resistor 143 has the same resistance as the wave impedance of bus 40, which is why there are no reflections on bus 40. In this instance, bus core 41 stands for the transmission of signal CAN_H and bus core 42 stands for the transmission of signal CAN_L.

The circuit described previously is greatly simplified with reference to resistor 143. In reality, two 60Ω resistors connected in series are present at the end of each line of bus cores 41, 42. The respective midpoint is set at 2.5 V.

In transmitter unit 12 of FIG. 3, the setpoint voltage characteristic on bus 40 is generated internally with the aid of a replica element, which includes Miller capacitor 121, current sources 122, PMOS transistor 124 and resistor 125, and is then transmitted via current mirrors 140, 145 to bus 40. The edge control is achieved by Miller capacitor 121, current sources 122, PMOS transistor 124 and resistor 125. Current mirrors 133, 140, 145 are formed by MOS low-voltage transistors identically designed in layout to obtain the same signal delays and the same saturation behavior in the CAN_H and CAN_L branches of the circuit shown in FIG. 3.

Hence, a method for reducing line-related emissions in bus system 1 is carried out using edge controller 120. In this instance, edge controller 120 generates a setpoint voltage characteristic on bus 40 using an element for generating the setpoint voltage characteristic for the symmetrization of switching edges in bus system 1 and transmits this voltage characteristic to bus 40 via current mirror 130.

The required voltage immunity is achieved with the aid of cascode steps formed from MOS high-voltage transistors, namely cascodes 132, 141, 146.

As is apparent from FIG. 3, the circuit of edge controller 120 is largely separated from bus 40, which is represented by bus cores 41, 42 and resistor 143. This advantage is achieved by the cascoding transistors, namely cascodes 132, 141, 146. Therefore, injected interferences, such as those caused by DPI, BCI, etc., are kept away from sensitive blocks, such as edge controller 120. The known rectification and storage effects belong to the past.

Thus, due to edge controller 120, the same currents are present on CAN_H and CAN_L during switching operations on bus 40, i.e., from recessive to dominant or vice versa. In doing so, ideal or nearly ideal switching operations exist for the same internal resistance on CAN_H, bus core 41 and CAN_L, bus core 42. Current sources 122, Miller capacitor 121 over PMOS transistor 124 and resistor 125 are matched to the switching behavior in combination with bus 40 in such a way that only minor common mode interferences result.

Moreover, in FIG. 3, an output transistor or first transistor 1400 is connected in parallel to output current mirror CAN_H 140. An output transistor or second transistor 1450 is connected in parallel to output current mirror CAN_L 145. First and second transistors 1400, 1450, each have no current limiting function, in practice, the maximum currents of first and second transistors 1400, 1450 are many times higher than in a specification "(OEM) Hardware Requirements for LIN CAN and FlexRay Interfaces in Automotive Applications," Version 1.3 from May 4, 2012, available from the German automotive manufactures Audi, BMW, Daimler, Porsche, Volkswagen, in which hardware requirements for OEMs LIN-, CAN- and FlexRay interfaces in automotive applications are specified (OEM=Original Equipment Manufacturer). First and second transistors 1400, 1450 are actuated by trigger circuit 150, shown in a simplified manner, having a multiple of transistors for meeting the demands of the DPI test, as described below. The transistors of trigger circuit 150 are switches without current limiting function. Transistors 1400, 1450 and trigger circuit 150 form a switching unit for switching the current limits of output current mirrors CAN_H 140 and CAN_L 145.

For the CAN bus, the edge steepness or edge time of signals CAN_L and CAN_H has a value of approximately <100 ns. Since opposite-phase signals CAN_L and CAN_H provide a symmetrical system, the high-frequency injection remains small. However, if detection unit 14 of user stations 10, 30 of FIG. 1 detects a high-frequency interference injection during a DPI test, it proceeds as follows.

The tolerance window for sending pulses of signals CAN_L and CAN_H is 200 ns and is thus twice as long as the edge time of signals CAN_L and CAN_H. This is utilized to close the switch implemented by transistors 1400, 1450 (FIG. 2) at the end of a setpoint edge of signals CAN_L and CAN_H or to open the switch implemented by output transistors 1400, 1450 in advance of the setpoint edge of signals CAN_L and CAN_H.

In this way, first and second transistors 1400, 1450 and trigger circuit 150 prevent that more current flowing in transmitter unit 12 in the negative direction through a parasitic diode of cascodes 141, 146 during the DPI test than permitted by the current limiting in the positive direction. This is achieved by switching off current limiting caused by cascodes 141, 146 in transmitter unit 12 in the positive direction during the DPI test, so that the mean values of the voltages on CAN_L and CAN_H do not shift and, therefore, no interference in the communication results.

In so doing, transistors 1400, 1450 in the present exemplary embodiment are switched on at the end of a recessive to dominant switching edge of the CAN signal, thus, from CAN_L or CAN_H. Transistors 1400, 1450 are switched off before the onset of a dominant to recessive switching edge of the CAN signal, i.e., from CAN_L or CAN_H.

In such a switching of transistors 1400, 1450, a system immune to injected interferences results without the edge steepness or edge time of signals CAN_L and CAN_H being changed.

In a modification of the present exemplary embodiment, first and second transistors 1400, 1450 are switched during a DPI test and when detecting a high-frequency interference injection using detection unit 14 from FIG. 1 in the following manner. Transistors 1400, 1450 are switched on in a recessive to dominant switching edge of the CAN signal and switched off in a dominant to recessive switching edge of the CAN signal. In particular, transistors 1400, 1450 are switched simultaneously with the setpoint edge of signals CAN_L and CAN_H. Such a switching also results in a system immune to injected interferences. In the present modification, the edge steepness or edge time of signals CAN_L and CAN_H is however changed, in particular, the edge steepness is increased and the edge time is shortened.

According to a second exemplary embodiment, the dominant bus state is symmetrized, which corresponds to dominant state 53. More specifically, the relationship between the currents in the direction of output current mirror CAN_H 140 and output current mirror CAN_L 145 is balanced. In so doing, current errors in different signal paths may be prevented, which may occur on the account of component mismatch. Advantageously, NMOS current bank 131 is formed in a balanced manner. Otherwise, bus system 1 is constructed as described in the first exemplary embodiment.

All previously described embodiments of bus system 1, of user stations 10, 30 of transmitter unit 12 and of the method may be used individually or in all possible combinations. In particular, an arbitrary number of combinations of the features of the exemplary embodiments are possible. In addition, the following modifications are particularly conceivable.

According to the exemplary embodiments, bus system 1 is in particular a CAN network or a CAN-FD network or a FlexRay network.

The quantity and positioning of user stations 10, 20, 30 in bus system 1 of the exemplary embodiments is arbitrary. In particular, only user stations 10 or only user stations 30 or only user stations 10, 30 may be present in bus system 1 of the exemplary embodiments.

User stations 10, 30 represent in particular for CAN-FD a possibility to improve upon the transmission quality of CAN-FD in the range of conventional CAN transmissions by utilizing a significantly higher data rate.

Detection unit 14 for the detection of an HF signal component 5 on message 45, 47 sent from transmitter unit 12 may also be situated outside of one or all of user stations 10, 20, 30.

The functionality of the exemplary embodiments described previously may also be implemented in a transceiver or a transceiver unit 15 or in a communication control unit 11, etc. Additionally, or alternatively, transmitter unit 12 may be integrated into existing products.

What is claimed is:

1. A user station comprising:
    a transmitter unit for sending via the bus system a message to another user station of the bus system, wherein at least temporarily an exclusive, collision-free access of a user station to a bus of the bus system is provided; and
    a switching unit for switching off a current limiting function of the transmitter unit when an HF signal component on the message sent by the transmitter unit is detected;
    wherein the switching unit includes:
    a first transistor that is connected in parallel to a first output current mirror for a signal CAN_L of the bus system and that does not have a current limiting function; and
    a second transistor that is connected in parallel to a second output current mirror for a signal CAN_H of the bus system and that does not have a current limiting function;
    wherein when the HF signal component on the message is detected: (i) the first transistor switches off a current limit of the first output mirror, and (ii) the second transistor switches off a current limit of the second output mirror.

2. The user station as recited in claim 1, wherein one of:
    the switching unit is configured to switch on the first and second transistors at an end of a recessive to dominant switching edge of signals CAN_L, CAN_H and to switch off the first and second transistors before an onset of a dominant to recessive switching edge of the signals CAN_L, CAN_H, and
    the switching unit is configured to switch on the first and the second transistors during the recessive to dominant switching edge of signals CAN_L, CAN_H and to switch off the first and second transistors during the dominant to recessive switching edge of the signals CAN_L, CAN_H.

3. The user station as recited in claim 1, wherein the switching unit is configured in such a manner that an edge time of signals CAN_L and CAN_H is not changed.

4. The user station as recited in claim 1, wherein:
    the transmitter unit includes an edge controller for symmetrizing switching edges in the bus system,
    the edge controller includes:
    an element for generating a setpoint voltage characteristic on a bus of the bus system, and
    a current mirror for transferring the generated setpoint voltage characteristic to the bus, and
    the element for generating the setpoint voltage characteristic includes at least one of:
    a Miller capacitor that is connected to a PMOS transistor on one side and to a resistor on another side, and
    two current sources that are connected to the PMOS transistor.

5. The user station as recited in claim 1, wherein the transmitter unit includes an edge controller for symmetrizing switching edges in the bus system, wherein the edge controller includes two current sources, a Miller capacitor, a PMOS transistor, and a resistor, and wherein the two current sources and the Miller capacitor are connected to a gate of the PMOS transistor.

6. The user station as recited in claim 4, wherein the current mirror is connected to the bus via MOS high-frequency transistors.

7. The user station as recited in claim 1, wherein the transmitter unit includes:
    a reverse polarity protection diode for protecting the user station against a potential of a dominant level in the bus system, and a reverse polarity protection diode against a signal CAN_L.

8. A bus system, comprising:
a bus; and
at least two user stations that are connected to one another via the bus in such a way that the user stations can communicate with one another, wherein at least one of the at least two user stations includes:
  a transmitter unit for sending via the bus system a message to another user station of the bus system, wherein at least temporarily an exclusive, collision-free access of a user station to a bus of the bus system is provided, and
  a switching unit for switching off a current limiting function of the transmitter unit when an HF signal component on the message sent by the transmitter unit is detected; and
a detection unit which detects the HF signal component on the message sent by the transmitter unit, wherein in response to detecting the HF signal component on the message sent by the transmitter unit, the detection unit triggers the switching unit to switch off the current limiting function of the transmitter unit;
wherein the switching unit includes:
  a first transistor that is connected in parallel to a first output current mirror for a signal CAN_L of the bus system and that does not have a current limiting function; and
  a second transistor that is connected in parallel to a second output current mirror for a signal CAN_H of the bus system and that does not have a current limiting function;
wherein when the HF signal component on the message is detected: (i) the first transistor switches off a current limit of the first output mirror, and (ii) the second transistor switches off a current limit of the second output mirror.

9. A method for increasing an interference immunity in an area of electromagnetic compatibility for a user station of a bus system, comprising:
  providing a transmitter unit that sends a message to another user station of the bus system via the bus system, an exclusive, collision-free access of a user station to a bus of the bus system being ensured at least temporarily; and
  providing a switching unit that switches off a current limiting function of the transmitter unit when an HF signal component on the message sent by the transmitter unit is detected; and
  providing a detection unit which detects an HF signal component on the message sent by the transmitter unit, wherein in response to detecting the HF signal component of the message sent by the transmitter unit, the detection unit triggers the switching unit to switch off the current limiting function of the transmitter unit;
wherein the switching unit includes:
  a first transistor that is connected in parallel to a first output current mirror for a signal CAN_L of the bus system and that does not have a current limiting function; and
  a second transistor that is connected in parallel to a second output current mirror for a signal CAN_H of the bus system and that does not have a current limiting function;
wherein when the HF signal component on the message is detected: (i) the first transistor switches off a current limit of the first output mirror, and (ii) the second transistor switches off a current limit of the second output mirror.

10. The user station as recited in claim 1, wherein the HF signal component on the message sent by the transmitter unit is detected by a detection unit, and wherein, in response to the detection unit detecting the HF signal component on the message sent by the transmitter unit, the detection unit triggers the switching unit to switch off the current limiting function of the transmitter unit.

11. The user station as recited in claim 1, wherein the switching unit switches off a current limiting function of the transmitter unit as a function of a signal from a detection unit indicating that the detection unit detected the HF signal component on the message sent by the transmitter unit.

* * * * *